(12) United States Patent
Bina et al.

(10) Patent No.: US 10,109,624 B2
(45) Date of Patent: Oct. 23, 2018

(54) SEMICONDUCTOR DEVICE COMPRISING TRANSISTOR CELL UNITS WITH DIFFERENT THRESHOLD VOLTAGES

(71) Applicant: Infineon Technologies AG, Neubiberg (DE)

(72) Inventors: Markus Bina, Sauerlach (DE); Franz-Josef Niedernostheide, Hagen a. T.W. (DE); Alexander Philippou, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/492,279

(22) Filed: Apr. 20, 2017

(65) Prior Publication Data

US 2017/0309619 A1    Oct. 26, 2017

(30) Foreign Application Priority Data

Apr. 20, 2016 (DE) .................. 10 2016 107 311

(51) Int. Cl.
| | |
|---|---|
| *H01L 27/092* | (2006.01) |
| *G11C 11/412* | (2006.01) |
| *H03K 19/094* | (2006.01) |
| *H01L 27/02* | (2006.01) |
| *G11C 11/40* | (2006.01) |
| *G02F 1/1362* | (2006.01) |
| *H01L 21/306* | (2006.01) |
| *H01L 27/082* | (2006.01) |
| *H03K 17/567* | (2006.01) |

(52) U.S. Cl.
CPC ........ *H01L 27/082* (2013.01); *H01L 27/0207* (2013.01); *H03K 17/567* (2013.01)

(58) Field of Classification Search
CPC ... H01L 27/0207; H01L 27/082; H01L 29/10; H03K 17/567
USPC ..... 327/108–112, 379, 389, 391; 326/22–27, 326/81–87
See application file for complete search history.

(56) References Cited

U.S. PATENT DOCUMENTS

| | | | |
|---|---|---|---|
| 5,426,605 A * | 6/1995 | Van Berkel | G11C 16/0466 257/E21.703 |
| 2002/0084493 A1* | 7/2002 | Marshall | G11C 11/412 257/369 |
| 2003/0122198 A1* | 7/2003 | Post | H01L 21/823807 257/369 |
| 2008/0061347 A1* | 3/2008 | Mallikararjunaswamy | H01L 27/115 257/314 |

(Continued)

*Primary Examiner* — Brandon S Cole
(74) *Attorney, Agent, or Firm* — Dicke, Billig & Czaja, PLLC

(57) ABSTRACT

An embodiment of a semiconductor device comprises a transistor cell array in a semiconductor body. The transistor cell array comprises transistor cell units. Each of the transistor cell units comprises a control terminal and first and second load terminals, respectively. The transistor cell units are electrically connected in parallel, and the control terminals of the transistor cells units are electrically connected. A first group of the transistor cell units includes a first threshold voltage. A second group of the transistor cell units includes a second threshold voltage larger than the first threshold voltage. A channel width of a transistor cell unit of the first group is smaller than a channel width of a transistor cell unit of the second group.

22 Claims, 8 Drawing Sheets

(56) References Cited

U.S. PATENT DOCUMENTS

| | | | |
|---|---|---|---|
| 2008/0315278 A1 | 12/2008 | Brown | |
| 2011/0261629 A1* | 10/2011 | Seshadri | G11C 5/147 365/189.09 |
| 2013/0293263 A1* | 11/2013 | Kurokawa | H03K 19/094 326/41 |
| 2014/0209905 A1* | 7/2014 | Meiser | H01L 23/544 257/48 |
| 2014/0332877 A1* | 11/2014 | Noebauer | H01L 27/0251 257/328 |
| 2015/0372087 A1 | 12/2015 | Fachmann et al. | |

* cited by examiner

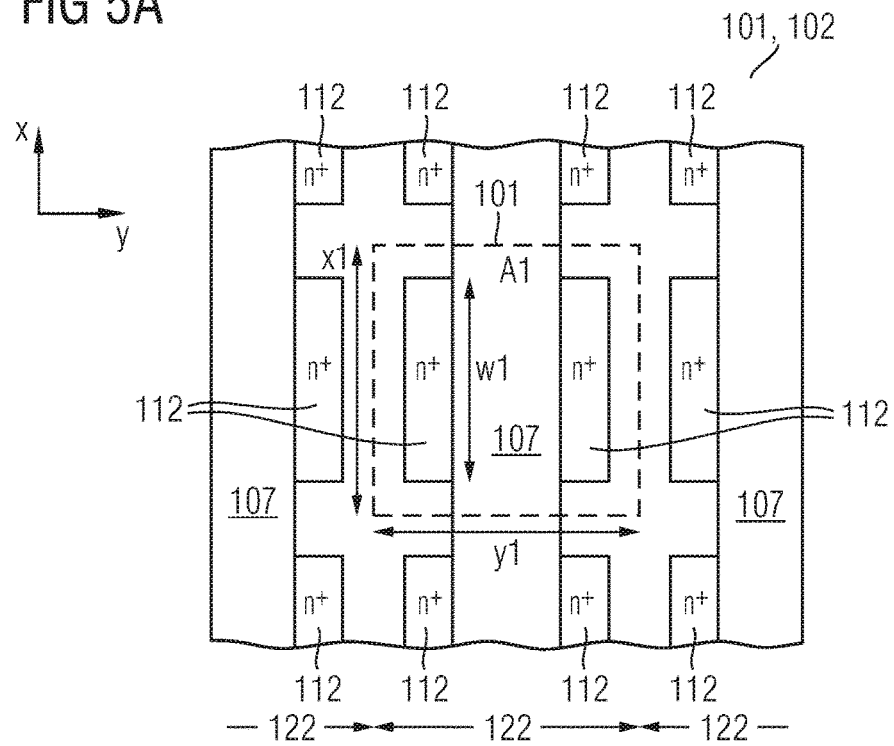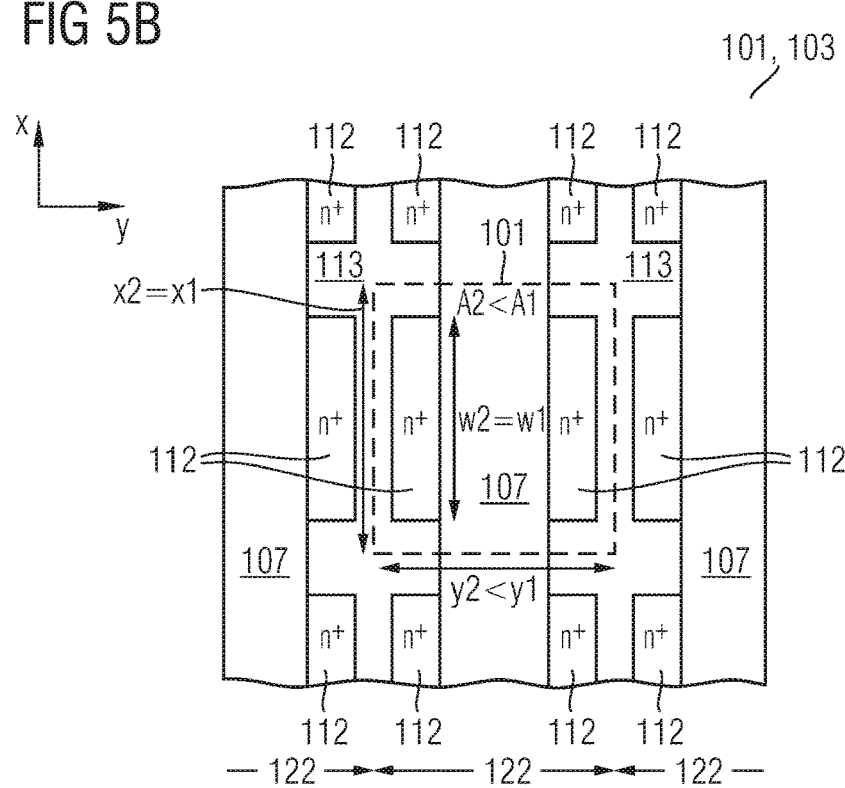

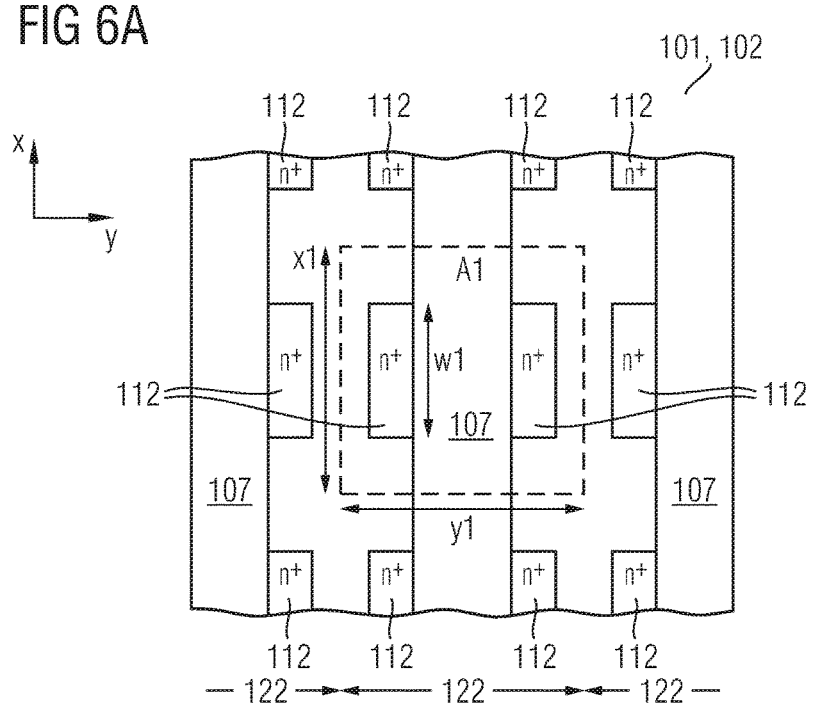
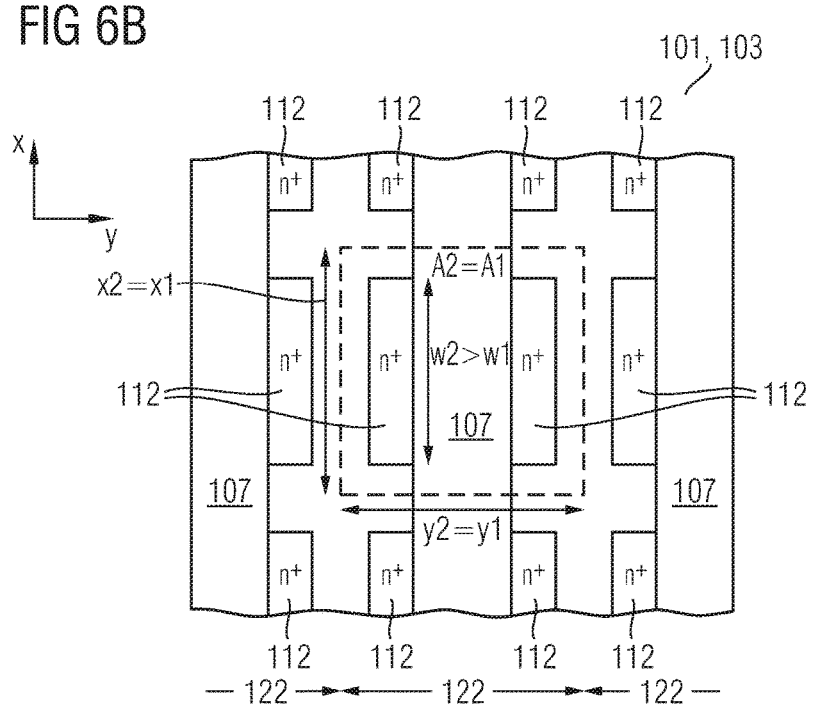

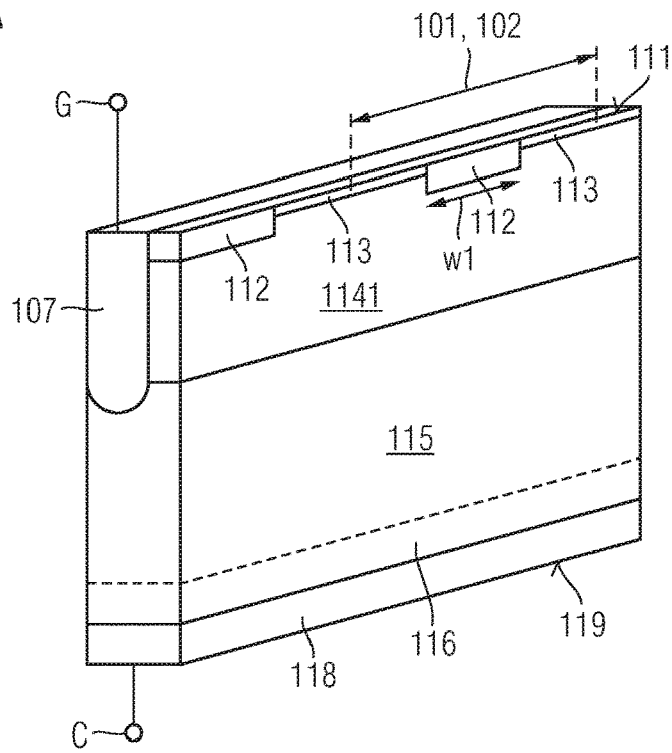
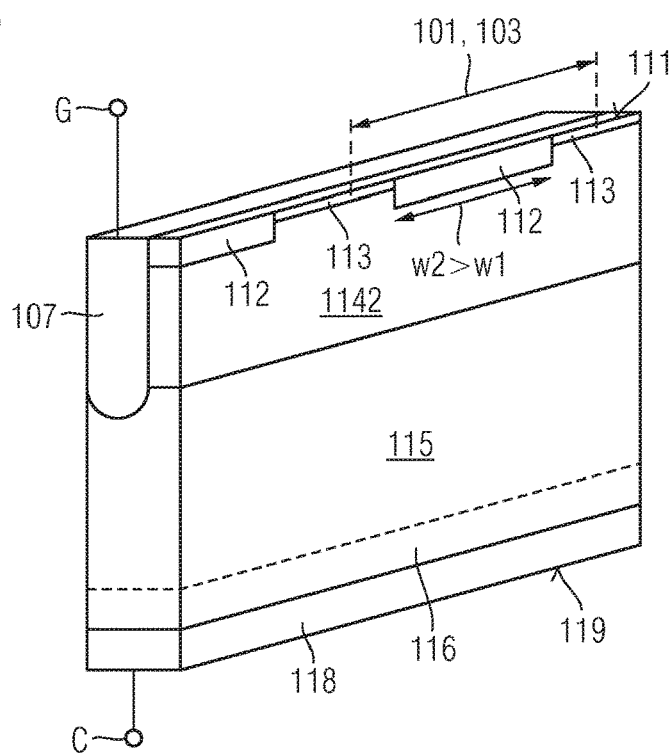

US 10,109,624 B2

SEMICONDUCTOR DEVICE COMPRISING TRANSISTOR CELL UNITS WITH DIFFERENT THRESHOLD VOLTAGES

CROSS-REFERENCE TO RELATED APPLICATION

This Utility patent application claims priority to German Patent Application No. 10 2016 107 311.3, filed Apr. 20, 2016 which is incorporated herein by reference.

BACKGROUND

Semiconductor devices such as insulated gate bipolar transistors (IGBTs) or insulated gate field effect transistors IGFETs) are widely used in switching loads, for example motors such as brushless DC motors, induction motors, servo motors, stepper motors, brushed DC motors or switched reluctance motors. When switching loads such as motors a trade-off between voltage gradient and switching losses hinders an independent optimization of each of these characteristics. Thus, it is desirable to provide a semiconductor device having an improved trade-off between voltage gradient and switching losses.

SUMMARY

The present disclosure relates to an embodiment of a semiconductor device. The semiconductor device comprises a transistor cell array in a semiconductor body. The transistor cell array comprises transistor cell units. Each of the transistor cell units comprises a control terminal and first and second load terminals, respectively. The transistor cells units are electrically connected in parallel, and the control terminals of the transistor cells units are electrically connected. A first group of the transistor cell units includes a first threshold voltage. A second group of the transistor cell units includes a second threshold voltage larger than the first threshold voltage. A channel width of a transistor cell unit of the first group is smaller than a channel width of a transistor cell unit of the second group.

The present disclosure also relates to another embodiment of a semiconductor device. The semiconductor device comprises a transistor cell array in a semiconductor body. The transistor cell array comprises transistor cell units. Each of the transistor cell units comprises a control terminal and first and second load terminals, respectively. The transistor cells units are electrically connected in parallel, and the control terminals of the transistor cells units are electrically connected. A first group of the transistor cell units includes a first threshold voltage. A second group of the transistor cell units includes a second threshold voltage larger than the first threshold voltage. A ratio of a channel width of a transistor cell unit of the first group to an area of the transistor cell unit of the first group is smaller than a ratio of a channel width of a transistor cell unit of the second group to an area of the transistor cell unit of the second group.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIGS. 5A and 5B are schematic top views of embodiments of stripe-shaped transistor sections including cell units having different ratios of channel width to area of the transistor cell unit.

FIGS. 6A and 6B are schematic top views of embodiments of stripe-shaped transistor sections including cell units having different channel widths.

FIGS. 7A and 7B are schematic perspective views of the stripe-shaped transistor sections illustrated in FIGS. 6A and 6B, respectively.

DETAILED DESCRIPTION

Figure 1:
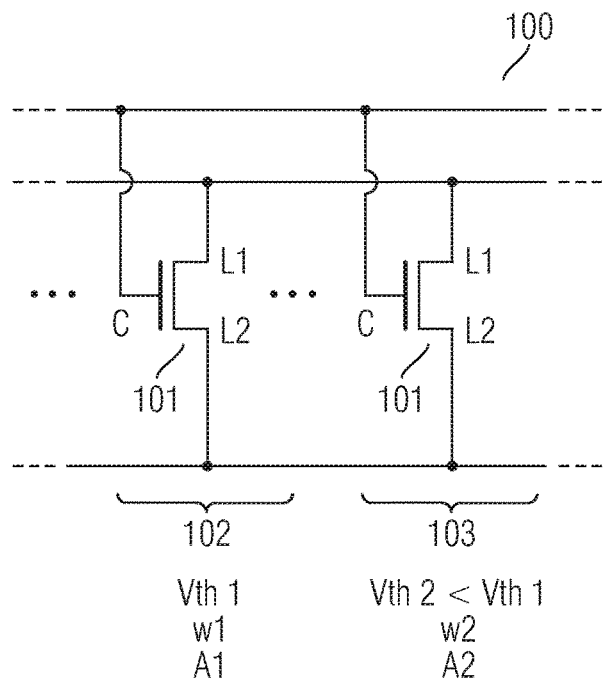
FIG. 1 is a schematic circuit diagram of a semiconductor device according to an embodiment.

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The figures illustrate relative doping concentrations by indicating "−" or "+" next to the doping type "n" or "p". For example, "n⁻" means a doping concentration that is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. As a typical base material for manufacturing a variety of such semiconductor devices, silicon wafers grown by the Czochralski (CZ) method, e.g. by the standard CZ method or by the magnetic CZ (MCZ) method or by the Continuous CZ (CCZ) method may be used. Also FZ (Float-Zone) silicon wafers may be used. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a semiconductor die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside or rear surface while the first surface is considered to be formed by the upper, front or main surface of the semiconductor substrate. The terms "above" and "below" as used in this specification therefore describe a relative location of a structural feature to another.

In this specification, embodiments are illustrated including p- and n-doped semiconductor regions. Alternatively, the semiconductor devices can be formed with opposite doping relations so that the illustrated p-doped regions are n-doped and the illustrated n-doped regions are p-doped.

The semiconductor device may have terminal contacts such as contact pads (or electrodes) which allow electrical contact to be made with the integrated circuit or discrete semiconductor device included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, Al, Ti, Ta, W, Ru, Mo and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating (electroless or electrochemical), molding, CVD (Chemical Vapor Deposition), physical vapor deposition (PVD), evaporation, hybrid physical-chemical vapor deposition (HP-CVD), printing etc.

The applied conductive layer may comprise, inter alia, one or more of a layer of metal such as Al, Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in e.g. particular a rectangular pattern, to the semiconductor wafer, e.g., according to one or more of the above mentioned techniques, optionally carry out a grinding process, and then pull the tape, e.g., along four orthogonal directions in the plane of the tape. By pulling the tape, the semiconductor wafer gets divided into a plurality of semiconductor dies (chips).

FIG. 1 is a circuit diagram for illustrating an embodiment of a semiconductor device 100. The semiconductor device 100 includes a transistor cell array in a semiconductor body. The transistor cell array includes transistor cell units 101 including a control terminal C and first and second load terminals L1, L2. The transistor cell units 101 are electrically connected in parallel and the control terminals C of the transistor cell units 101 are electrically connected. A first group 102 of the transistor cell units 101 includes a first threshold voltage Vth1. A second group 103 of the transistor cell units 101 includes a second threshold voltage Vth2 larger than the first threshold voltage Vth1, i.e. Vth2>Vth1. In some embodiments, a channel width w1 of a transistor cell unit 101 of the first group 102 is smaller than a channel width w2 of a transistor cell unit 101 of the second group 103, i.e. w1<w2. In some embodiments, a ratio of a channel width w1 of a transistor cell unit 101 of the first group 102 to an area A1 of the transistor cell unit 101 of the first group 102 is smaller than a ratio of a channel width w2 of a transistor cell unit 101 of the second group 103 to an area A2 of the transistor cell unit 101 of the second group 103, i.e. w1/A1<w2/A2.

The term "transistor cell unit" used herein refers to a small or smallest functional part of a transistor cell array. The transistor cell array used herein refers to a parallel connection of multiple transistor cell units. For example, a transistor cell unit may have a polygonal, for example rectangular, square, hexagonal, octagonal, circular or elliptic shape. The shape refers to a projection of an overall dimension of the transistor cell unit to a main surface of the semiconductor body, for example a front surface of the semiconductor body. In other words, the shape refers to an overall dimension when viewing the overall dimension of the transistor cell unit along a direction perpendicular to the main surface, for example a top view.

The term "channel width" of a transistor cell unit used herein refers to an extension of a channel along a direction perpendicular to a direction where current flows along the channel in an on-state between source and drain or emitter and collector. The channel width covers those parts along that direction where an inversion channel can be formed when a gate voltage exceeds the threshold voltage and when a source region abuts that part of the channel for electrically connecting the channel to the source terminal. In other words, a channel width may be reduced by interrupting a source region or by deactivating parts of a channel by other means, for example by increasing a threshold voltage above a level where other parts of the channel turn on, or by increasing a gate dielectric thickness of that part of the channel compared with other parts, or by decreasing a gate dielectric constant of that part of the channel compared with other parts, or by any combination of these measures or other measures of similar effect. Thus, a channel width is measured along a direction different from a direction along which a channel length is measured. The channel length is measured along a direction where current flows along the channel in an on-state between source and drain, for example. In case of curved and/or tilted channel sections, the width of the channel is measured along these curved and/or tilted channel sections. Although the above illustrations refer to an n-channel enhancement (normally-off) IGBT or MOS transistor, where a drain current will only flow when a gate voltage is applied to the gate terminal greater than the threshold voltage level in which conductance takes place, other transistor types such as p-channel enhancement (normally-off) IGBT or MOS transistors may be likewise used and the relations with regard to the threshold voltage refer to absolute values of the threshold voltage.

The term "area" of a transistor cell unit used herein refers a surface area of a projection of an overall dimension of the transistor cell unit to the main surface.

In some embodiments, the area A1 of a transistor cell unit 101 of the first group 102 is equal to an area A2 of a transistor cell unit 101 of the second group 103. The channel width w1 of a transistor cell unit 101 of the first group 102 may be set smaller than a channel width w2 of a transistor cell unit 101 of the second group 103 by one or more of the measures described above.

In some embodiments, a transistor cell unit 101 of the second group 103 equals a transistor cell unit 101 of the first group 102 scaled to smaller lateral dimensions. In some embodiments, dimensions a and b of a transistor cell unit 101 of the first group 102 along different lateral directions, for example along directions where length and width refer to and/or along axes of transistor cell symmetry, may be scaled down by an integer p, p being equal to or greater than 2. The dimensions may also be scaled down by different integers p, q depending on the dimension a or b, each one of p, q being an integer equal to or greater than 2. As an example, the transistor cell unit may be scaled down by the integer p along the direction where the dimension a is measured and the transistor cell unit may be scaled down by the integer q along the direction where the dimension b is measured. According to another example, the transistor cell unit may be scaled down by the integer p along the direction where the dimension b is measured and the transistor cell unit may be scaled down by the integer q along the direction where the dimension a is measured.

In some embodiments, the area A1 of a transistor cell unit 101 of the second group 103 is smaller than an area of a transistor cell unit 101 of the first group 102.

In some embodiments, a channel length of a transistor cell unit 101 of the second group 103 differs from, for example is larger than or is smaller than a channel length of a transistor cell unit 101 of the first group 102.

In some embodiments, the semiconductor device 100 is an insulated gate bipolar transistor (IGBT). In some other embodiments, the semiconductor device 100 is an insulated gate field effect transistor (IGFET). In yet some other embodiments, the semiconductor device 100 is a bipolar junction transistor (BJT). In some embodiments, the semiconductor device 100 is a power semiconductor device having a specified maximum continuous load current (i.e. specified maximum continuous current between drain and source of an IGFET or between collector and emitter of an IGBT) in a range from 20 A to 3600 A. In some embodiments, the power semiconductor device has a specified maximum voltage between the load terminals (i.e. specified maximum collector-emitter voltage of an IGBT or maximum drain-source voltage of an IGFET) in a range from 600 V to 6.5 kV, for example 600V, or 1.2 kV, or 1.7 kV, or 3.3 kV, or 6.6 kV. The specified maximum ratings can be taken from a datasheet of a semiconductor device, for example.

In some embodiments, an active cell area includes the transistor cell units 101 of the first and second groups 102, 103. When dividing the active cell area in n sub-areas of equal area, a ratio of a number of transistor cell units of the first group to a number of transistor cell units of the second group differs by less than 30% among the n sub-areas, n being an integer between 3 and 5. Depending on outer dimensions of the transistor cell array, the n sub-areas may have equal shapes, for example square shape or rectangular shape, or may have different or at least partly different shapes, for example in case of asymmetric layout of the transistor cell array caused by layout constraints such as surrounding device pads or further circuit elements, for example.

In some embodiments, an active cell area includes the transistor cell units 101 of the first group 102 and the second group 103, and the transistor cell units 101 of the first and second groups 102, 103 are uniformly distributed over the active cell area. Uniform distribution of the transistor cell units 101 of the first and second groups 102, 103 enables a uniform heating of the semiconductor body caused by the load current flowing through the semiconductor body in an on-state of the semiconductor device 100, for example. Thereby, undesired effects based on hot spots may be counteracted.

In some embodiments, the second threshold voltage Vth2 exceeds the first threshold voltage Vth1 by 10% to 80%. In some embodiments, the first threshold voltage ranges from 4 V to 8V, or from 5 V to 7 V.

In some embodiments, the semiconductor device 100 further comprises additional groups of transistor cell units. A threshold voltage of a transistor cell unit of one of the additional groups differs from a threshold voltage of a transistor cell unit of any other group.

In some embodiments, the transistor cell units 101 of the first group 102 and of the second group 103 include transistor cell units 101 of polygonal shape, for example square shape, rectangular shape, hexagonal shape, octagonal shape.

In some embodiments, an area A1 of a polygonal transistor cell unit 101 of the first group 102 equals an area A2 of a polygonal transistor cell unit 101 of the second group 103, and a lateral extension of a source region of the polygonal transistor cell unit of the first group is smaller than a lateral extension of a source region of the polygonal transistor cell unit of the second group. Thereby, a channel width w1 of a transistor cell unit 101 of the first group 102 is set smaller than a channel width w2 of a transistor cell unit 101 of the second group 103.

In some embodiments, an area A1 of a polygonal transistor cell unit 101 of the first group 102 equals an area A2 of a polygonal transistor cell unit of the second group, and a lateral extension of a source region of the polygonal transistor cell unit 101 of the first group 102 is smaller than a lateral extension of a source region of the polygonal transistor cell unit 101 of the second group 103.

In some embodiments, an area A1 of a polygonal transistor cell unit 101 of the first group 102 equals an area A2 of a polygonal transistor cell unit 101 of the second group 103, and a lateral extension of a channel deactivation implant zone of the polygonal transistor cell unit 101 of the first group 102 is greater than a lateral extension of a channel deactivation implant zone 105 of the polygonal transistor cell unit 101 of the second group 103.

In some embodiments, the transistor cell array includes stripe-shaped transistor sections arranged parallel to each other. Each one of the stripe-shaped transistor sections includes a plurality of transistor cell units 101 arranged one after another. A dimension of a transistor cell unit 101 of the first group 102 along a lateral direction perpendicular to a direction of extension of the stripe-shaped transistor sections is larger than a dimension of a transistor cell unit 101 of the second group 103 along the lateral direction. Thereby, an area A1 of a transistor cell unit 101 of the first group 102 may be set greater than an area A2 of a transistor cell unit 101 of the second group 103.

In some embodiments, the transistor cell array includes stripe-shaped transistor sections arranged parallel to each other. Each one of the stripe-shaped transistor sections includes a plurality of transistor cell units 101 arranged one after another along a direction of extension of the stripe-shaped transistor sections. A dimension of a transistor cell unit 101 of the first group 102 along the direction of extension of the stripe-shaped transistor sections is larger than a dimension of a transistor cell unit of the second group along the direction of extension of the stripe-shaped transistor sections.

In some embodiments, a dose of doping of a body region of a transistor cell unit 101 of the second group 103 is larger than a dose of doping of a body region of a transistor cell unit 101 of the first group 102. Thereby, a threshold voltage Vth2 a transistor cell unit 101 of the second group 103 is set larger than a threshold voltage Vth1 a transistor cell unit 101 of the first group 102. In some embodiments, a profile of doping concentration of a body region of a transistor cell unit 101 of the second group 103 along a vertical direction perpendicular to a main surface runs above, i.e. at higher doping concentration values than a profile of doping concentration of a body region of a transistor cell unit 101 of the first group 102 along the vertical direction.

In some embodiments, a transistor cell unit 101 of the second group 103 includes a channel threshold implant zone that is absent in a transistor cell unit 101 of the first group 102. Thereby, the channel threshold implant zone may increase a threshold voltage of that part of a channel section that is to be deactivated.

Some embodiments relate to an electronic circuit. The electronic circuit includes the semiconductor device 100 according to any of the embodiments described above. The electronic circuit includes a multi output voltage level gate driver. An output of the multi output voltage level gate driver and a control terminal of the transistor cell units are electrically connected.

Figure 2:
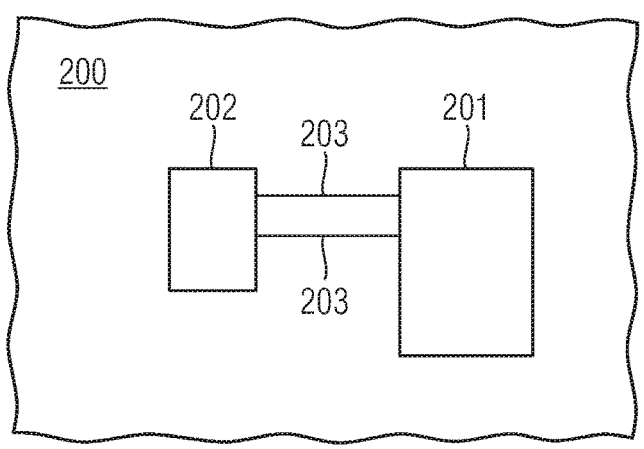
FIG. 2 is a schematic view of an electronic circuit further comprising a printed circuit board mechanically supporting and electrically connecting a semiconductor device and a multi output voltage level gate driver.

In some embodiments, the semiconductor device 100 and the gate driver are separate electronic components, and the electronic circuit further comprises a printed circuit board mechanically supporting and electrically connecting the semiconductor device and the gate driver. As an example of an electronic circuit, the schematic view of FIG. 2 illustrates a part of a printed circuit board 200. A first semiconductor chip 201 is mounted on the printed circuit board 200. The first semiconductor chip 201 includes the semiconductor device 100 according to any of the embodiments described above. A second semiconductor chip 202 is mounted on the printed circuit board 200. The second semiconductor chip 202 includes a multi output voltage level gate driver 202. An output of the multi output voltage level gate driver 202 and a control terminal, for example a gate terminal of the semiconductor device 100 of the first semiconductor chip 201 are electrically connected by a wiring 203 of the printed circuit board 200. A gate driving voltage at an output of the multi output voltage level gate driver 202 may be set depending on an a current to be switched, for example indicated by an input signal at an input pin of the multi output voltage level gate driver 202.

The semiconductor device 100 enables the technical benefit of adapting a current-carrying area to an amount of current that is to be switched. The adaption is based on different threshold voltages for different groups of transistor cell units. The current-carrying areas may be optimized with regard to different nominal currents without agreeing to a comprise between voltage gradient and switching losses. By further adapting the channel width in regard to each group of transistor cell units, the current voltage characteristics of the transistor cell units of the different groups can be matched for avoiding maldistributions of current density during switching operation.

Figure 3A:
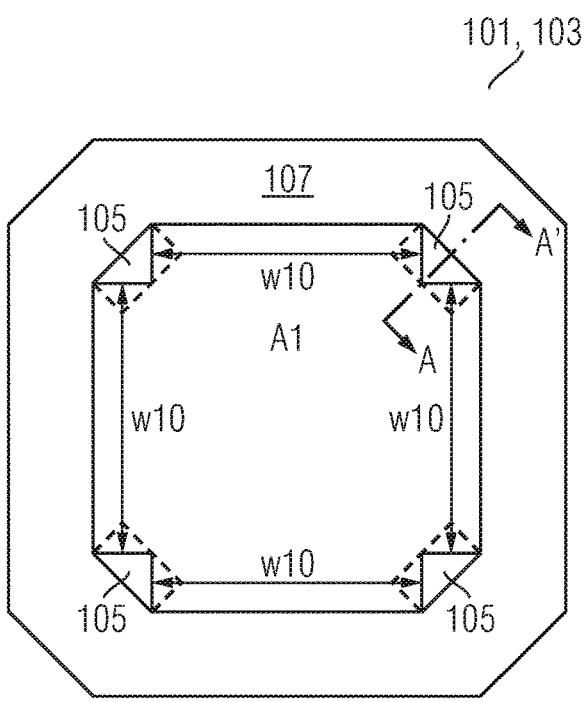
FIGS. 3A and 3B are schematic top views of embodiments of polygonal transistor cell units having different channel widths.
Figure 3B:
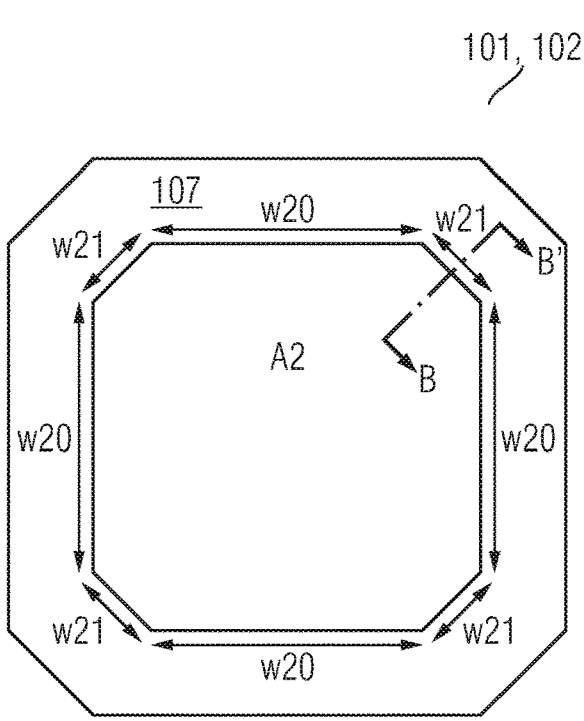

The schematic top view of FIG. 3A illustrates a square transistor cell unit 101 having slanted corners. The transistor cell unit 101 is a transistor cell unit of a first group 102 of transistor cell units. The schematic top view of FIG. 3B illustrates a square transistor cell unit 101 having slanted corners. The transistor cell unit 101 is a transistor cell unit of a second group 103 of transistor cell units.

In the embodiment illustrated in FIGS. 3A, 3B an area A1 of the transistor cell unit 101 of the first group 102 equals an area A2 of the transistor cell unit 101 of the second group 103 and each of the transistor cell units 101 includes a gate structure 107. Other than the transistor cell units 101 of the second group 103, the transistor cell unit 101 of the first group 102 includes a channel deactivation implant zone 105 abutting the slanted corners of the gate structure 107. Thereby, a channel width w1 of the transistor cell unit 101 of the first group 102 is set smaller than a channel width w2 of a transistor cell unit 101 of the second group 103. Due to the channel deactivation implant zone 105, the channel width w1 of a transistor cell unit 101 of the first group 102 sums up to four times a width w10, i.e. w1=4×w10, w10 being a distance between two slanted corner portions.

The channel width w2 of a transistor cell unit 101 of the second group 103 sums up to four times a width w10 plus four times a channel width w21, i.e. w1=4×w20+4×w21, w20 (being equal to w10) being a distance between two slanted corner portions and w21 being an extension of the channel at a slanted corner portion.

The channel deactivation implant zone 105 may also be present in the transistor unit cell of the second group 103 provided that w2>w1, for example by setting a lateral extension of the channel deactivation implant zone 105 of the transistor cell unit 101 of the first group 102 larger than in the second group 103 or by applying further measures allowing for a further reduction of the channel width w1.

In the embodiment illustrated in FIG. 3A the channel deactivation implant zone 105 is triangular. In some other embodiments, the channel deactivation implant zone 105 may have alternative or additional shapes, for example rectangular shape (indicated by a dashed line in FIG. 3A, square shape, circular shape, elliptic shape.

For illustration purposes, only selected elements are shown in the top views of FIGS. 3A, 3B.

Figure 3C:
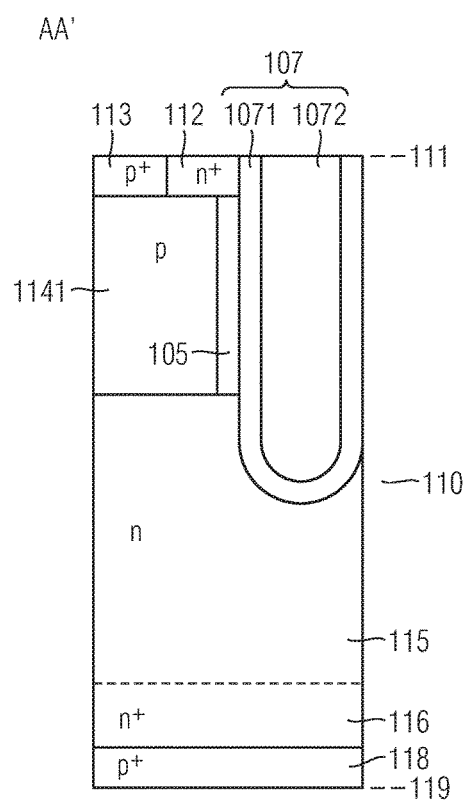
FIGS. 3C and 3D are cross sectional views the polygonal transistor cell units illustrated in FIGS. 3A and 3B, respectively.

An example of a schematic cross-sectional view along line AA' of the transistor cell unit 101 of the first group 102 of FIG. 3A is illustrated in FIG. 3C.

The gate structure 107 extends into a semiconductor body 110 from a first surface 111. The gate structure 107 includes a gate dielectric 1071 and a gate electrode 1072. A source region 112 and a body contact region 113 adjoin the first surface 111. The body contact region 113 adjoins a body region 1141 arranged below the source region 112 and the body contact region 113. As an alternative or in addition to the body contact region 113, other measures for providing a low-ohmic contact to the body region 1141 may be taken, for example formation of contact grooves filled with conductive material(s). The channel deactivation implant zone 105 adjoins a sidewall of the gate structure 107. The semiconductor device further includes a drift zone 115 and an optional field stop zone 116. A rear side emitter 118 adjoins a second surface 119 opposite to the first surface 111. The cross-sectional view of FIG. 3C is one example of an IGBT including an emitter at the first surface 111 and a collector at the second surface 119.

Figure 3D:
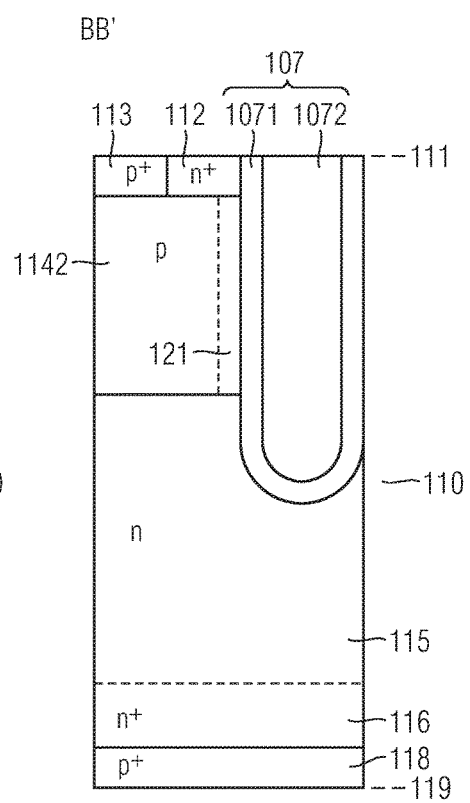

An example of a schematic cross-sectional view along line BB' of the transistor cell unit 101 of the second group 103 of FIG. 3B is illustrated in FIG. 3D.

Other than in the schematic cross-sectional view along of the transistor cell unit 101 of the first group 102 of FIG. 3C, the channel deactivation implant zone 105 is missing and a second threshold voltage Vth2 defined by a body region 1142 is set larger than a first threshold voltage Vth1 defined by the body region 1141 of the transistor cell unit 101 of the first group 102 in FIG. 3C. A part of the body region 1142 adjoining the gate dielectric 1071 constitutes a channel region 121. By altering a voltage applied to the gate electrode 1072, a conductivity of the channel region may be switched between an on-state when a gate voltage exceeds the second threshold voltage Vth2 and an off-state when the gate voltage is below the second threshold voltage Vth2.

Alternative measures of adjusting channel width and threshold voltage may be applied to the transistor cell units 101 illustrated in FIGS. 3A to 3D. Some of these measures are described above with respect to FIG. 1.

Figure 4B:
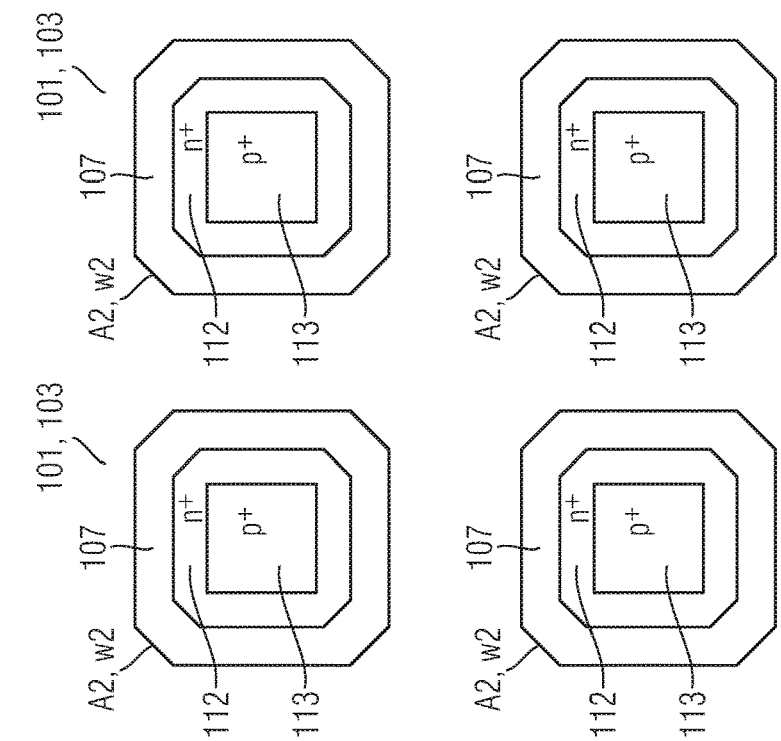
FIGS. 4A and 4B are schematic top views of embodiments of polygonal transistor cell units having different ratios of channel width to area of the transistor cell unit.
Figure 4A:
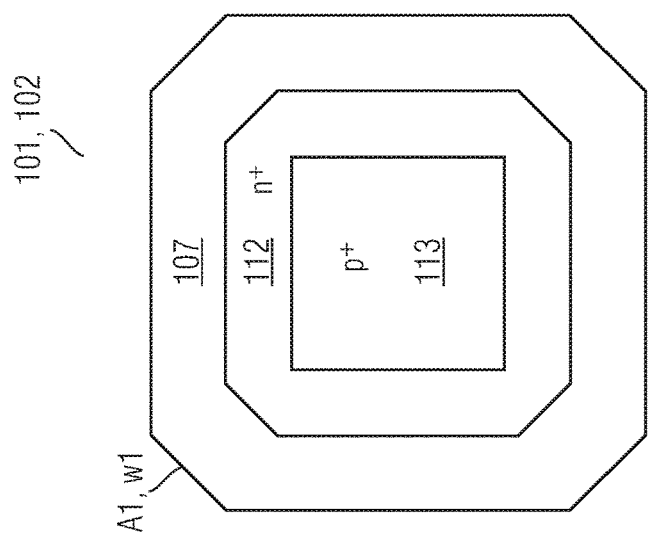

Referring to the schematic top views illustrated in FIGS. 4A and 4B, a ratio of a channel width w1 of a transistor cell unit 101 of the first group 102 to an area A1 of the transistor cell unit 101 of the first group 102 is smaller than a ratio of a channel width w2 of a transistor cell unit 101 of the second group 103 to an area A2 of the transistor cell unit 101 of the second group 103, i.e. w1/A1<w2/A2. The transistor cell unit 101 of the second group 103 illustrated in FIG. 4B equals a transistor cell unit 101 of the first group 102 illustrated in FIG. 4A that is scaled to smaller lateral dimensions.

Referring to the schematic top views illustrated in FIGS. 5A and 5B, the transistor cell array includes stripe-shaped transistor sections 122 arranged parallel to each other, wherein each one of the stripe-shaped transistor sections 122 includes a plurality of transistor cell units 101 arranged one after another along a direction x of extension of the stripe-shaped transistor sections 122. In the embodiments illustrated in FIGS. 5A and 5B a dimension y1 of a transistor cell unit 101 of the first group 102 along a lateral direction y perpendicular to the direction x of extension of the stripe-shaped transistor sections 122 is larger than a dimension y2 of a transistor cell unit 101 of the second group 103 along the lateral direction y, i.e. y1>y2. A dimension x1 of a transistor cell unit 101 of the first group 102 along the lateral direction x of extension of the stripe-shaped transistor sections 122 equals a dimension x2 of a transistor cell unit 101 of the second group 103 along the lateral direction y, i.e. x1=x2. Thus, A channel width of a transistor cell unit 101 of the first group 102 equals a channel width w2 of a transistor cell unit 101 of the second group 103, i.e. w1=w2. Thus, a ratio of a channel width w1 of a transistor cell unit 101 of the first group 102 to an area A1 (A1=x1×y1) of the transistor cell unit 101 of the first group 102 is smaller than a ratio of a channel width w2 of a transistor cell unit 101 of the second group 103 to an area A2 (A2=x2×y2) of the transistor cell unit 101 of the second group 103, i.e. w1/A1<w2/A2.

Referring to the schematic top views illustrated in FIGS. 6A and 6B, the transistor cell array includes stripe-shaped transistor sections 122 arranged parallel to each other, wherein each one of the stripe-shaped transistor sections 122 includes a plurality of transistor cell units 101 arranged one after another along a direction x of extension of the stripe-shaped transistor sections 122. In the embodiments illustrated in FIGS. 6A and 6B dimensions x1, y1 of a transistor cell unit 101 of the first group 102 along the lateral directions x, y equal dimensions x2, y2 of a transistor cell unit 101 of the second group 103, respectively, i.e. x1=x2, y1=y2. An extension of the source region 112 of a transistor cell unit 101 of the first group 102 along the lateral direction x is set smaller than an extension of the source region 112 of a transistor cell unit 101 of the second group 103 along the lateral direction x. Thus, a channel width w1 of a transistor cell unit 101 of the first group 102 is set smaller than a channel width w2 of a transistor cell unit 101 of the first group 102, i.e. w1<w2.

The schematic views of FIGS. 7A, 7B are perspective views of the transistor cell units 101 of the first and second groups 102, 103 illustrated in FIGS. 6A, 6B, respectively. A gate terminal G is electrically connected to the gate structure 107 at the first surface 111 and a collector terminal C is electrically connected to the rear side emitter 118 at the second surface 119.

Figure 8:
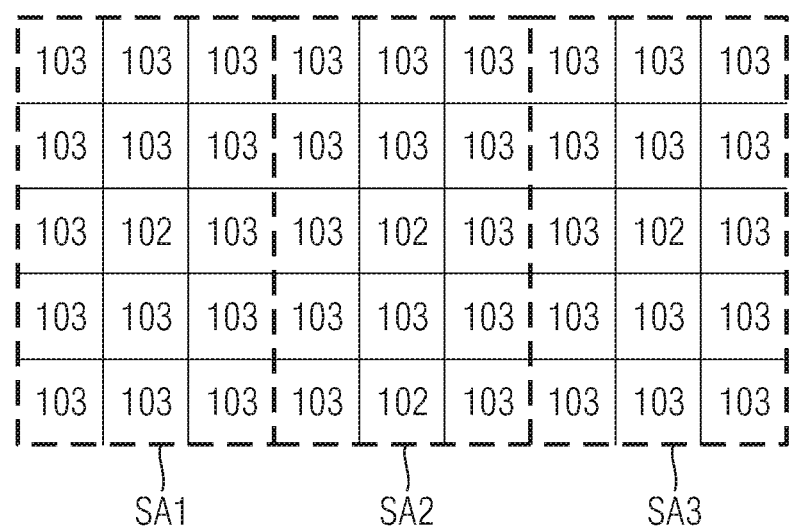
FIG. 8 is a schematic top view of different transistor cell units equally distributed over an active cell area.

The schematic top view of a transistor cell array illustrated in FIG. 8 is one example of an active cell area including the transistor cell units 101 of the first group 102 and the second group 103. The transistor cell units 101 of the first group 102 and the transistor cell units 101 of the second group 103 are uniformly distributed over the active cell area. When dividing the active cell area in three sub-areas SA1, SA2, SA3 of equal area, a ratio of a number of transistor cell units 101 of the first group 102 to a number of transistor cell units of the second group 103 differs by less than 30% among the three sub-areas SA1, SA2, SA3. Depending on the layout and size of the active cell area, another division of the active cell area into sub-areas may apply. Each of the sub-areas may include tens, hundreds, thousands, or tens of thousands of transistor cell units 101, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a transistor cell array in a semiconductor body, the transistor cell array comprising a first group of transistor cell units and at least a second group of transistor cell units, wherein each one of the transistor cell units of the first group and of the second group comprise a control terminal, a first load terminal and a second load terminal, wherein the transistor cell units of the first group and of the second group are electrically connected in parallel, and the control terminals of the transistor cells units of the first group and of the second group are electrically connected together;
the first group of the transistor cell units has a first threshold voltage;
the second group of the transistor cell units has a second threshold voltage larger than the first threshold voltage; and wherein
a channel width of a transistor cell unit of the first group is smaller than a channel width of a transistor cell unit of the second group.

2. The semiconductor device of claim 1, wherein an area of a transistor cell unit of the first group is equal to an area of a transistor cell unit of the second group.

3. A semiconductor device, comprising:
a transistor cell array in a semiconductor body, the transistor cell array comprising a first group of transistor cell units and at least a second group of transistor cell units, wherein each one of the transistor cell units of the first group and of the second group comprise a control terminal, a first load terminal and a second load terminal, wherein the transistor cell units of the first group and of the second group are electrically connected in parallel, and the control terminals of the transistor cells units are electrically connected together;
the first group of the transistor cell units has a first threshold voltage;
the second group of the transistor cell units has a second threshold voltage larger than the first threshold voltage; and wherein
a ratio of a channel width of a transistor cell unit of the first group to an area of the transistor cell unit of the first group is smaller than a ratio of a channel width of a transistor cell unit of the second group to an area of the transistor cell unit of the second group.

4. The semiconductor of claim 3, wherein a transistor cell unit of the second group equals a transistor cell unit of the first group scaled to smaller lateral dimensions.

5. The semiconductor device of claim 3, wherein an area of a transistor cell unit of the second group is smaller than an area of a transistor cell unit of the first group.

6. The semiconductor device of claim 1, wherein the semiconductor device is an insulated gate bipolar transistor.

7. The semiconductor device of claim 1, wherein an active cell area includes the transistor cell units of the first and second groups, and wherein, when dividing the active cell area in n sub-areas of equal area, a ratio of a number of transistor cell units of the first group to a number of transistor cell units of the second group differs by less than 30% among the n sub-areas, n being an integer between 3 and 5.

8. The semiconductor device of claim 1, wherein an active cell area includes the transistor cell units of the first group and the second group, and the transistor cell units of the first group and of the second group are uniformly distributed over the active cell area.

9. The semiconductor device of claim 1, wherein the second threshold voltage exceeds the first threshold voltage by 10% to 80%.

10. The semiconductor device of claim 1, further comprising additional groups of transistor cell units, wherein a threshold voltage of a transistor cell unit of one of the additional groups differs from a threshold voltage of a transistor cell unit of any other group.

11. The semiconductor device of claim 1, wherein the transistor cell units of the first group and of the second group include transistor cell units of polygonal shape.

12. The semiconductor device of claim 11, wherein a lateral dimension of a polygonal transistor cell unit of the second group equals a lateral dimension of a polygonal transistor cell unit of the first group divided by p, p being an integer in a range of 2 to 5.

13. The semiconductor device of claim 11, wherein
an area of a polygonal transistor cell unit of the first group equals an area of a polygonal transistor cell unit of the second group, and wherein
a lateral extension of a source region of the polygonal transistor cell unit of the first group is smaller than a lateral extension of a source region of the polygonal transistor cell unit of the second group.

14. The semiconductor device of claim 11, wherein
an area of a polygonal transistor cell unit of the first group equals an area of a polygonal transistor cell unit of the second group, and wherein
a lateral extension of a channel deactivation implant zone of the polygonal transistor cell unit of the first group is greater than a lateral extension of a channel deactivation implant zone of the polygonal transistor cell unit of the second group.

15. The semiconductor device of claim 1, wherein
the transistor cell array includes stripe-shaped transistor sections arranged parallel to each other, wherein each one of the stripe-shaped transistor sections includes a plurality of transistor cell units arranged one after another; and
a dimension of a transistor cell unit of the first group along a lateral direction perpendicular to a direction of extension of the stripe-shaped transistor sections is larger than a dimension of a transistor cell unit of the second group along the lateral direction.

16. The semiconductor device of claim 1, wherein
the transistor cell array includes stripe-shaped transistor sections arranged parallel to each other, wherein each one of the stripe-shaped transistor sections includes a plurality of transistor cell units arranged one after another along a direction of extension of the stripe-shaped transistor sections; and a dimension of a transistor cell unit of the first group along the direction of extension of the stripe-shaped transistor sections is larger than a dimension of a transistor cell unit of the second group along the direction of extension of the stripe-shaped transistor sections.

17. The semiconductor device of claim 1, wherein a dose of doping of a body region of a transistor cell unit of the second group is larger than a dose of doping of a body region of a transistor cell unit of the first group.

18. The semiconductor device of claim 1, wherein a transistor cell unit of the second group includes a channel threshold implant zone that is absent in a transistor cell unit of the first group.

19. The semiconductor device of claim 1, wherein a channel length of a transistor cell unit of the second group differs from a channel length of a transistor cell unit of the first group.

20. An electronic circuit, comprising:

the semiconductor device of claim 1; and a multi output voltage level gate driver, wherein an output of the multi output voltage level gate driver and a control terminal of the transistor cell units are electrically connected.

21. The electronic circuit of claim 20, wherein the semiconductor device and the gate driver are separate electronic components, and the electronic circuit further comprises a printed circuit board mechanically supporting and electrically connecting the semiconductor device and the gate driver.

22. The electronic circuit of claim 20, wherein the multi output level gate driver further comprises an input pin configured to receive an input signal to set a gate driving voltage level at the output of the multi output voltage level gate driver.

* * * * *